(12) United States Patent
Cao

(10) Patent No.: US 6,563,262 B1
(45) Date of Patent: May 13, 2003

(54) THIN METAL-OXIDE LAYER AS STABLE ELECTRON-INJECTING ELECTRODE FOR LIGHT EMITTING DIODES

(75) Inventor: Yong Cao, Goleta, CA (US)

(73) Assignee: DuPont Displays, Inc., Santa Barbara, CA (US)

( * ) Notice: Subject to any disclaimer, the term of this patent is extended or adjusted under 35 U.S.C. 154(b) by 115 days.

(21) Appl. No.: 09/697,381

(22) Filed: Oct. 26, 2000

Related U.S. Application Data

(63) Continuation of application No. 09/173,157, filed on Oct. 14, 1998.

(51) Int. Cl.$^7$ .............................................. H05B 33/00
(52) U.S. Cl. ...................................... 313/506; 313/503
(58) Field of Search ................................ 313/502, 503, 313/504, 506, 498, 512; 257/11, 78, 102, 103; 428/690, 917; 315/169.3

(56) References Cited

U.S. PATENT DOCUMENTS

| | | | |
|---|---|---|---|
| 4,885,211 A | * 12/1989 | Tang et al. | 428/457 |
| 5,029,320 A | 7/1991 | Kido et al. | 357/17 |
| 5,047,687 A | 9/1991 | VanSlyke | 313/503 |
| 5,059,862 A | 10/1991 | VanSlyke et al. | 313/503 |
| 5,151,629 A | 9/1992 | VanSlyke | 313/504 |
| 5,189,136 A | 2/1993 | Wudl et al. | 528/86 |
| 5,247,190 A | 9/1993 | Friend et al. | 257/40 |
| 5,317,169 A | 5/1994 | Nakano et al. | 257/40 |
| 5,408,109 A | 4/1995 | Heeger et al. | 257/40 |
| 5,512,654 A | 4/1996 | Holmes et al. | 528/373 |
| 5,552,678 A | * 9/1996 | Tang et al. | 315/169.3 |
| 5,626,795 A | 5/1997 | Cao et al. | 252/500 |
| 5,677,572 A | 10/1997 | Hung et al. | 257/750 |
| 5,723,873 A | 3/1998 | Yang | 257/40 |
| 5,747,930 A | 5/1998 | Utsugi | 313/504 |
| 5,776,623 A | * 7/1998 | Hung et al. | 428/690 |
| 5,798,170 A | 8/1998 | Zhang et al. | 428/212 |
| 5,869,350 A | 2/1999 | Heeger et al. | 438/29 |

FOREIGN PATENT DOCUMENTS

| | | |
|---|---|---|
| EP | 0 740 489 | 10/1996 |
| WO | WO 98/10473 | 3/1998 |
| WO | WO 98/27136 | 6/1998 |

OTHER PUBLICATIONS

Parker, I.D., Kim, H.H., "Fabrication of polymer light–emitting diodes using doped silicon electrodes," *Appl. Phys. Lett.*, vol. 64, No. 14, pp. 1774–1776 (1994c).

Parker, I.D., Pei, Q., Marrocco, M., "Efficient blue electroluminescence from a fluorinated polyquinoline," *Appl. Phys. Lett.*, vol. 65, No. 10, pp. 1272–1274 (1994a).

Scott, J.C., Kaufman, J.H., Brock, P.J., DiPietro, R., Salem, J., Goitia, J.A., "," *J. Appl. Phys.*, vol. 79, No. 5, pp. 2745–2751 (1996).

(List continued on next page.)

Primary Examiner—Ashok Patel

(57) ABSTRACT

This invention relates generally to the field of light emitting diodes (LEDs). More particularly, this invention relates to organic light emitting diodes which employ an electron-injecting cathode comprising a thin layer of an oxide of a low work function metal. More specifically, the present invention relates to LEDs which comprise: (a) a hole-injecting anode layer; (b) an electron-injecting cathode layer; and, (c) an emissive layer; wherein: (i) said emissive layer is interposed between said anode layer and said cathode layer; (ii) said emissive layer comprises an electroluminescent, semiconducting, organic material; (iii) said cathode layer comprises a layer of metal oxide having a thickness of from about 15 to about 200 Å; and, (iv) said metal oxide is selected from the group consisting of alkali metal oxides, alkaline earth metal oxides, lanthanide metal oxides, and mixtures thereof.

30 Claims, 5 Drawing Sheets

OTHER PUBLICATIONS

Tumareva, T.A., Ivanov, V.A., Kirsanova, T.S., Vasil'eva, N.V., "Field–electron spectroscopy of barium oxide films with various structures," *Sov. Phys. Solid State*, vol. 31, No. 2., pp. 182–185 (1989).

Wudl, F., Hoger, S., Zhang, C., Pakbaz, K., Heeger, A.J., "Conjugated Polymers for Organic LED'S: Poly[2,5–bis(–3α–5β–cholestanoxy)–phenylenevinylene] (BCHA–PPV): A Processible Yellow Light Emitter," *Polymer Preprints*, vol. 34, No. 1, pp. 197–198 (1993b).

Yang, Y., Heeger, A.J., "Polyaniline as a transparent electrode for polymer light–emitting diodes:lower operating voltage and higher efficiency," *Appl. Phys. Lett.*, vol. 64, No. 10, pp. 1245–1247 (1994).

Yang, Y., Westerweele, E., Zhang, C., Smith, P., Heeger, A.J., "Enhanced performance of polymer light–emitting diodes using high–surface area polyaniline network electrode," *J. Appl. Phys.*, vol. 77, No. 2, pp. 694–698 (1995).

Yang, Z., Sokolik, I., Karasz F.E., "Soluble blue light–emitting polymer," *Macromolecules*, vol. 26, pp. 1188–1190 (1993).

Yu, G., Heeger, A.J., "High efficiency photonic devices made with semiconducting polymers," *Synthetic Metals*, vol. 85, pp. 1183–1186 (1997).

Zhang, C., Hoger, S., Pakbaz, K., Wudl, F., Heeger, A.J., "Improved efficiency in green polymer light–emitting diodes with air–stable electrodes," *J. Electron. Mater.*, vol. 23, No. 5, pp. 453–458 (1994a).

Zhang, C., von Seggern, H. Pakbaz, K., Kraabel, B., Schmidt, H.–W., Heeger, A.J., "Blue electroluminescent diodes utilizing blends of poly(p–phenylphenylene vinylene) in poly(9–vinylcarbazole)," *Synthetic Metals*, vol. 62, pp. 35–40 (1994b).

Wakimoto, T. et al. (Aug. 1997). "Organic electro–luminescence cells using alkaline metal compounds as electron injection materials," *Trans. on Electron Devices* 44(8):1245–1248.

Berggren, M., Inganas, O., Gustafsson, G., Rasmusson, J., Andersson, M.R., Hjertbert T., Wennerstrom, O., "Controlling colour by voltage in polymer light emitting diodes," *Synthetic Metals*, vol. 71, pp. 2185–2186 (1995).

Braun, D., Gustafsson, G., McBranch D., Heeger, A.J., "Electroluminescence and electrical transport in poly(3–thiophene) diodes," *J. Appl. Phys.*, vol. 72, pp. 564–568 (1992).

Braun, D., and Heeger, A.J., "Visible light emission from semiconducting polymer diodes," *Appl. Phys. Lett.*, vol. 58, pp. 1982–1984 (1991).

Bredas, J.–L., Silbey, R., eds., *Conjugated Polymers*, Kluwer Academic Press, Dordrecht (1991).

Burroughs, J.H., Bradley, D.D.C., Brown, A.R., Marks, R.N., Mackay, K., Friend, R.H., Burns, P.L., Holmes, A.B., "Light–emitting diodes based on conjugated polymers," *Nature*, vol. 347, pp. 539–541 (1990).

G. Gustafsson, G., Cao, Y., Treacy, G.M., Klavetter, F., Colaneri, N., Heeger, A.J., "Flexible Light–emitting diodes made from soluble conducting polymers," *Nature*, vol. 357, pp. 477–479 (1992).

Greenham, N.C. Moratti, S.C., Bradley, D.D.C., Friend, R.H., Holmes, A.B., "Efficient light–emitting diodes based on polymers with high electron affinities," *Nature*, vol. 365, pp. 628–630 (1993).

Grem, G., Leditzky, G., Ullrich, B., Leising, G., "Realization of blue–light–emitting device using poly(–p–phenylene)," *Adv. Mater.*, vol. 4, pp. 36–37 (1992).

Haas, G.A., Shih, A., Thomas, R.E., "Determination of conduction band and electron affinity in surface potential measurements of BaO", *J. Appl. Phys.*, vol. 47, pp. 5400–5404 (1976).

Haas, G.A.. Shih, A., Thomas, R.E., "Electronic and chemical behavior of oxygen in BaO films on Ir(100)" *Applications of Surface Sci.*, vol. 1, pp. 59–80 (1977).

Kido, J., Shionoya, H., Nagai, K., "Single–layer white light–emitting organic electroluminescent devices based on dye–dispersed poly(N–vinylcarbazole)," *Appl. Phys. Lett.*, vol. 67, No. 16, pp. 2281–2283 (1995).

Parker, I.D., "Carrier tunneling and device characteristics in polymer light–emitting diodes," *J. Appl. Phys.*, vol. 75, No. 3, pp. 1656–1666 (1994b).

\* cited by examiner

THIN METAL-OXIDE LAYER AS STABLE ELECTRON-INJECTING ELECTRODE FOR LIGHT EMITTING DIODES

This is a continuation of application Ser. No. 09/173,157 filed Oct. 14, 1998, now pending.

FIELD OF THE INVENTION

This invention relates generally to the field of light emitting diodes (LEDs). More particularly, this invention relates to organic light emitting diodes which employ an electron-injecting cathode comprising a thin layer of an oxide of a low work function metal. More specifically, the present invention relates to LEDs which comprise: (a) a hole-injecting anode layer; (b) an electron-injecting cathode layer; and, (c) an emissive layer; wherein: (i) said emissive layer is interposed between said anode layer and said cathode layer; (ii) said emissive layer comprises an electroluminescent, semiconducting, organic material; (iii) said cathode layer comprises a layer of metal oxide having a thickness of from about 15 to about 200 Å; and, (iv) said metal oxide is selected from the group consisting of alkali metal oxides, alkaline earth metal oxides, lanthanide metal oxides, and mixtures thereof.

BACKGROUND

Throughout this application, various publications, patents, and published patent applications are referred to by an identifying citation; full citations for these documents may be found at the end of the specification immediately preceding the claims. The disclosures of the publications, patents, and published patent specifications referenced in this application are hereby incorporated by reference into the present disclosure to more fully describe the state of the art to which this invention pertains.

Diodes and particularly light emitting diodes (LEDs) fabricated with conjugated organic polymer layers have attracted attention due to their potential for use in display technology (Burroughs et al., 1990, Braun et al., 1991). Among the promising materials for use as active layers in polymer LEDs are poly(phenylene vinylene), PPV, and soluble derivatives of PPV such as poly(2-methoxy-5-(2'-ethyl-hexyloxy)-1,4-phenylene vinylene), MEH-PPV, a semiconducting polymer with an energy gap Eg of ~2.1 eV. This material is described in more detail in Wudl et al., 1993a. Another material described as useful in this application is poly(2,5-bis(cholestanoxy)-1,4-phenylene vinylene), BCHA-PPV, a semiconducting polymer with an energy gap Eg of ~2.2 eV. This material is described in more detail in Wudl et al., 1993a, 1993b. Other suitable polymers include, for example, the poly(3-alkylthiophenes) as described by Braun et al., 1992 and related derivatives as described by Berggren et al., 1992; poly(para-phenylene) as described by Grem et al., 1992, and its soluble derivatives as described by Yang et al., 1993; and polyquinoline as described by Parker, 1994a. Blends of conjugated semiconducting polymers with non-conjugated host or carrier polymers are also useful as the active layer in polymer LEDs, as described by Zhang et al., 1994b. Also useful are blends comprising two or more conjugated polymers, as described by Yu et al., 1997. Generally, materials for use as active layers in polymer LEDs include semiconducting conjugated polymers, more specifically semiconducting conjugated polymers which exhibit photoluminescence, and still more specifically semiconducting conjugated polymers which exhibit photoluminescence and which are soluble and processible from solution into uniform thin films.

In the field of organic polymer-based LEDs, it is common to employ a relatively high work function metal as the anode, which serves to inject holes into the otherwise filled π-band of the semiconducting, electroluminescent polymer. Relatively low work function metals are preferred as the cathode material, which serves to inject electrons into the otherwise empty π*-band of the semiconducting, electroluminescent polymer. The holes which are injected at the anode and the electrons which are injected at the cathode recombine radiatively within the active layer and light is emitted. Proposed criteria for suitable electrodes are described in detail by Parker, 1994b.

Typical relatively high work function materials for use as anode materials include transparent conducting thin films of indium/tin-oxide (see, for example, Burroughs et al., 1990, Braun et al., 1991). Alternatively, thin.films of polyaniline in the conducting emeraldine salt form can be used (see, for example, Cao et al, 1997 Gustafsson et al., 1992., Yang-et al., 1994, 1995, and Yang, 1998). Thin films of indium/tin-oxide and thin films of polyaniline in the conducting emeraldine salt form are preferred because, as transparent electrodes, both permit the emitted light from the LED to radiate from the device in useful levels.

Typical relatively low work function metals which are suitable for use as cathode materials are metals such as calcium, magnesium, and barium. Alkali metals tend to be too mobile and act to dope the emissive layer (e.g. electroluminescent polymer), thereby causing shorts and unacceptably short device lifetimes. Alloys of these low work function metals, such as, for example, alloys of magnesium in silver and alloys of lithium in aluminum, are also known (see, for example, VanSlyke, 1991a, 1991b, Heeger et al., 1995). The thickness of the electron injection cathode layer typically ranges from about 200 to about 5000 Å (see, for example, VanSlyke, 1992, Friend et al., 1993, Nakano et al., 1994, Kido et al., 1995). A lower limit of about 200 to about 500 Å is required in order to form a continuous film (full coverage) for a cathode layer (see, for example, Holmes et al., 1996, Utsugi, 1998, Scott et al., 1996; Parker et al., 1994c). In addition to good coverage, thicker cathode layers were believed to provide self-encapsulation to keep oxygen and water vapor away from the active parts of the device.

Unfortunately, although the use of low work function electrodes is required for efficient injection of electrons from the cathode and for satisfactory device performance, low work function metals are typically unstable and readily react with oxygen and/or water vapor at room temperature and even more vigorously at elevated temperatures. Although alloying such low work function metals with more stable metals, such as, for example, aluminum or silver, has been used in attempts to improve environmental stability, the resulting cathodes remain unstable with respect to reaction with oxygen and/or water vapor during device fabrication and processing.

Despite improvements in the construction of polymer LEDs, a persistent problem has been rapid decay of the device efficiency (and light output) during stress, especially at elevated temperature. There is thus a need for low work function cathodes for use as electron-injecting contacts in organic (e.g., polymer) LEDs which have improved stability with respect to reaction with oxygen and water vapor especially at elevated temperature, and hence longer device lifetimes.

The alkali metals, alkaline earth metals and lanthanide metals are low work function metals. Although highly reactive (for example, with respect to oxygen and water vapor), they are utilized as cathodes in polymer or organic light-emitting diodes (LEDs) because they function as excellent electron-injecting contacts.

Applicants have discovered that cathodes comprising a thin layer of metal oxide (which metal oxide is selected from the group consisting of alkali metal oxides, alkaline earth metal oxides, lanthanide metal oxides, and mixtures thereof) yield LEDs which offer comparable or better initial performance (e.g., brightness and efficiency), as well as comparable or extended operating lives, as compared to similar LEDs which employ conventional (e.g., metal) cathodes.

SUMMARY OF THE INVENTION

One aspect of the present invention pertains to light-emitting diodes (LEDs) comprising: (a) a hole-injecting anode layer; (b) an electron-injecting cathode layer; and, (c) an emissive layer; wherein: (i) said emissive layer is interposed between said anode layer and said cathode layer; (ii) said emissive layer comprises an electroluminescent, semiconducting, organic material; (iii) said cathode layer comprises a layer of metal oxide having a thickness of from about 5 to about 200 Å; and, (iv) said metal oxide is selected from the group consisting of alkali metal oxides, alkaline earth metal oxides, lanthanide metal oxides, and mixtures thereof.

In one embodiment, said metal oxide is selected from the group consisting of alkali metal oxides. In one embodiment, said metal oxide is selected from the group consisting of oxides of lithium, sodium, potassium, rubidium, and cesium. In one embodiment, said metal oxide is lithium oxide. In one embodiment, said metal oxide is selected from the group consisting of alkaline earth metal oxides. In one embodiment, said metal oxide is selected from the group consisting of oxides of magnesium, calcium, strontium, and barium. In one embodiment, said metal oxide is selected from the group consisting of oxides of magnesium and barium. In one embodiment, said metal oxide is selected from the group consisting of lanthanide metal oxides. In one embodiment, said metal oxide is selected from the group consisting of oxides of neodymium, samarium, and ytterbium.

In one embodiment, said layer of metal oxide has a thickness of from about 10 to about 100 Å. In one embodiment, said layer of metal oxide has a thickness of from about 20 to about 60 Å.

In one embodiment, said cathode layer further comprises a capping layer comprising aluminum, silver, or copper.

In one embodiment, said electroluminescent, semiconducting, organic material is an electroluminescent, semiconducting, organic polymer. In one embodiment, said electroluminescent, semiconducting, organic material is selected from the group consisting of: poly(p-phenylene vinylene)s, poly(arylene vinylene)s, poly(p-phenylene)s, poly(arylene)s, and polyquinolines. In one embodiment, said electroluminescent, semiconducting, organic material is poly(2-(3,7-dimethyloctyloxy)-5-methoxy-1,4-phenylene vinylene).

In one embodiment, said electroluminescent, semiconducting, organic material is an electroluminescent, semiconducting, organic non-polymeric material.

DETAILED DESCRIPTION OF THE INVENTION

The present invention pertains to light-emitting diodes (LEDs) which comprise: (a) a hole-injecting anode layer; (b) an electron-injecting cathode layer; and, (c) an emissive layer; wherein: (i) said emissive layer is interposed between said anode layer and said cathode layer; (ii) said emissive layer comprises an electroluminescent, semiconducting, organic material; (iii) said cathode layer comprises a layer of metal oxide having a thickness of from about 15 to about 200 Å; and, (iv) said metal oxide is selected from the group consisting of alkali metal oxides, alkaline earth metal oxides, lanthanide metal oxides, and mixtures thereof.

Figure 1:
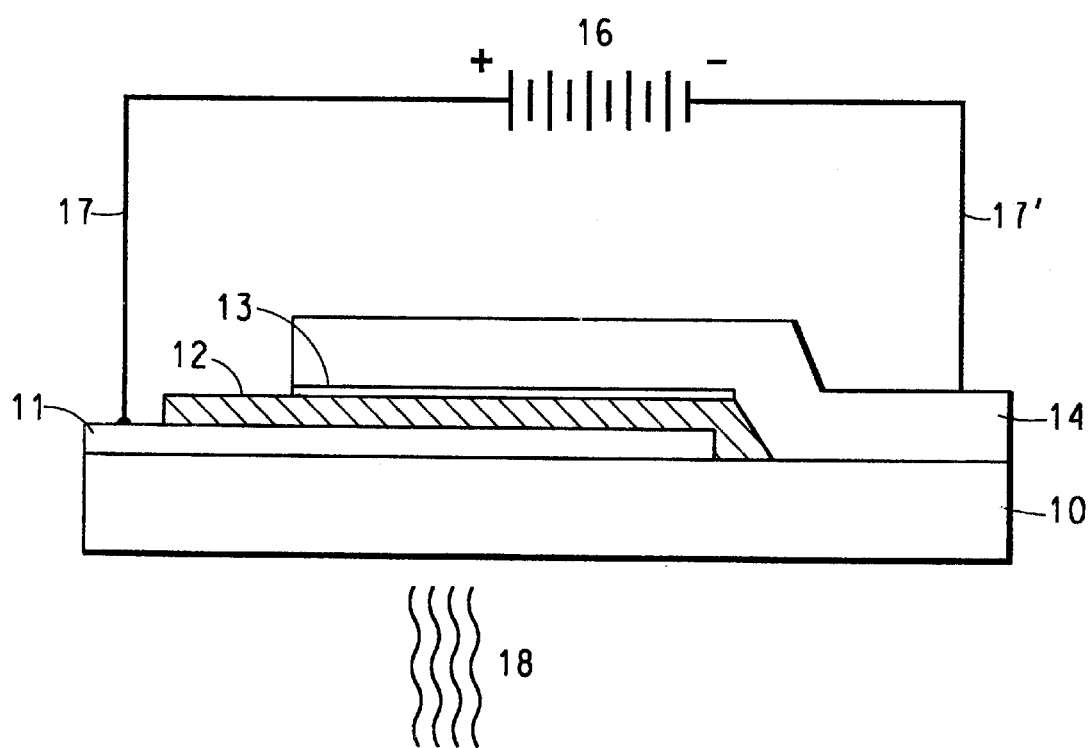
FIG. 1 is a cross-sectional schematic view (not to scale) of a typical solid state LED of the present invention.

A cross-sectional schematic view (not to scale) of a typical solid state LED of the present invention is illustrated in FIG. 1. The typical LED comprises a transparent substrate (10), a transparent hole-injecting anode layer (11), an emissive layer (12), an electron-injecting cathode layer (13), and a capping layer (14). Typically, in operation, a power source (16) is connected to the anode layer (11) and the capping layer (14) via leads (17 and 17'), and emitted light (18) emerges from the transparent substrate (10).

The LEDs of the present invention are characterized by an electron-injecting cathode layer which comprises a thin layer of metal oxide, which metal oxide is selected from the group consisting of alkali metal oxides, alkaline earth metal oxides, lanthanide metal oxides, and mixtures thereof. In other respects, the LEDs of the present invention are similar to LEDs known in the art which comprise an electroluminescent, semiconducting, organic material "sandwiched" between an anode layer and a cathode layer. Note that, by the terms "interposed" and "sandwiched," it is meant that the emissive layer is positioned between the anode layer and the cathode layer, and does not exclude the possibility that additional intervening layers, such as those discussed below, may be positioned between the emissive layer and the anode layer, and between the emissive layer and the cathode layer.

Other layers which are known in the art to enhance the performance of the LED can also be incorporated, if desired. These include, for example, electron transport layers and/or hole transport layers as described by Greenham et al., 1993; Zhang et al., 1994a; and Zhang et al., 1998.

The LEDs of the present invention are also characterized by comparable or extended operating lives, as compared to similar LEDs which employ conventional (e.g., metal) cathodes. Applicants believe that the use of these metal oxides in the cathode layer acts to postpone the decay of efficiency and light output of the device. The LEDs of the present invention also offer comparable or better initial performance (e.g., brightness and efficiency), as compared to similar LEDs which employ conventional (e.g., metal) cathodes.

Metal Oxide Electron-injecting Cathode Layers

The LEDs of the present invention comprise an electron-injecting cathode layer, which cathode layer comprises a layer of metal oxide having a thickness of from about 15 to about 200 Å, which metal oxide is selected from the group consisting of alkali metal oxides, alkaline earth metal oxides, lanthanide metal oxides, and mixtures thereof. The metal oxide layer functions as a stable contact which efficiently injects electrons into the emissive layer.

The term "alkali metal" is used herein in the conventional sense to refer to elements of Group IA of the periodic table. Preferred alkali metals include lithium (i.e., Li), sodium (i.e., Na), potassium (i.e., K), rubidium (i.e., Rb), and cesium (i.e., Cs).

The term "alkali metal oxide" is used herein in the conventional sense to refer to compounds of one or more alkali metals and oxygen. For convenience, alkali metal oxides are referred to herein by the chemical formula of the corresponding simple oxide (e.g., $Li_2O$, $Na_2O$, $K_2O$, $Rb_2O$, and $Cs_2O$); however, this reference to the simple oxide is intended to encompass other oxides, including mixed oxides and non-stoichiometric oxides (e.g., $Li_xO$, $Na_xO$, $K_xO$, $Rb_xO$, and $Cs_xO$, where x is from about 0.1 to about 2).

The term "alkaline earth metal" is used herein in the conventional sense to refer to elements of Group IIA of the periodic table. Preferred alkaline earth metals include magnesium (i.e., Mg), calcium (i.e., Ca), strontium (i.e., Sr), and barium (i.e., Ba).

The term "alkaline earth metal oxide" is used herein in the conventional sense to refer to compounds of one or more alkaline earth metals and oxygen. For convenience, alkaline earth metal oxides are referred to herein by the chemical formula of the corresponding simple oxide (e.g., MgO, BaO, CaO, SrO, and BaO); however, this reference to the simple oxide is intended to encompass other oxides, including mixed oxides and non-stoichiometric oxides (e.g., $Mg_xO$, $Ba_xO$, $Ca_xO$, $Sr_xO$, and $Ba_xO$, where x is from about 0.1 to about 1).

The term "lanthanide metal" is used herein in the conventional sense to refer to elements of the lanthanide series of the periodic table, from cerium (i.e., Ce) through lutetium (i.e., Lu). Preferred lanthanide metals include samarium (i.e., Sm), Ytterbium (i.e., Yb), and neodymium (i. e., Nd).

The term "lanthanide metal oxide" is used herein in the conventional sense to refer to compounds of one or more lanthanide metals and oxygen. For convenience, lanthanide metal oxides are referred to herein by the chemical formula of the corresponding simple oxide of the +3 valency state (e.g., $Sm_2O_3$, $Yb_2O_3$, and $Nd_2O_3$); however, this reference to the simple oxide is intended to encompass other oxides, including mixed oxides and non-stoichiometric oxides (e.g., $Sm_xO$, $Yb_xO$, and $Nd_xO$, where x is from about 0.1 to about 1.5).

The metal oxide layer has a thickness of less than about 200 Å, typically from about 5 to about 200 Å.

In one embodiment, the metal oxide layer has a thickness from about 5 to about 100 Å.

In one embodiment, the metal oxide layer has a thickness from about 10 to about 100 Å.

In one embodiment, the metal oxide layer has a thickness from about 20 to about 100 Å.

In one embodiment, the metal oxide layer has a thickness from about 30 to about 100 Å.

In one embodiment, the metal oxide layer has a thickness from about 5 to about 80 Å.

In one embodiment, the metal oxide layer has a thickness from about 10 to about 80 Å.

In one embodiment, the metal oxide layer has a thickness from about 20 to about 80 Å.

In one embodiment, the metal oxide layer has a thickness from about 30 to about 80 Å.

In one embodiment, the metal oxide layer has a thickness from about 5 to about 60 Å.

In one embodiment, the metal oxide layer has a thickness from about 10 to about 60 Å.

In one embodiment, the metal oxide layer has a thickness from about 20 to about 60 Å.

In one embodiment, the metal oxide layer has a thickness from about 30 to about 60 Å.

The thin layer of metal oxide can be fabricated using known deposition techniques, including, but not limited to, thermal deposition, vacuum evaporation, sputtering, and electron beam deposition, and using various starting materials, including, but not limited to, pure metals, alloys, and metal oxides. In one embodiment, the metal oxide layer is formed by thermal deposition of the corresponding metal under a controlled pressure of oxygen. The thickness of the metal oxide layer can be controlled by the rate and time of evaporation/deposition. A typical rate of evaporation/deposition is about 0.2 to 1 Å per second.

Thin metal oxide layers with thickness below 100 Å form granules with diameters of several hundred Angstroms. In one embodiment, a capping layer of a high work function metal is deposited on top of the thin metal oxide layer to provide continuous electrical connection to isolated granules of the metal oxide and to provide a first level of encapsulation. Thus, the surface of the emissive layer need not be completely covered by the metal oxide layer; uncovered surface is then contacted with the subsequent capping layer. Examples of suitable high work function (and high electrical conductivity) capping metals include aluminum, silver, copper, and the like. The thickness of the capping layer is typically a few hundred Angstroms or greater, and often a few thousand Angstroms.

Typically, when thin metal oxide layers are used for enhanced electron injection, as in the present invention, only one "turn-on" is observed in the current-voltage (I–V) curve at around 1.6 V, indicating minimal discontinuities in the thin layer of metal oxide. As can be seen from FIG. 2, a thin barium oxide layer (as an electron-injection layer) shows a turn-on voltage similar to that obtained for a thin barium metal layer. This result indicates that the effective work function of a thin barium oxide layer is very close to that of barium metal. Monolayer barium oxide has been used to provide a low work function surface for electron emission in cathode ray tubes (CRT) (see for example, Haas et al., 1976, 1977, Tumareva et al., 1989). The near equality of the work function of barium oxide and barium has been reported previously (for example, see Tumareva et al., 1989). This observation was explained by the presence of a band of surface levels formed by the donor-type state (Tumareva et al., 1989). Alternatively, this observation was explained as resulting from the formation of an oxygen-vacancy lattice by oxygen diffusion into the substrate (Haas et al., 1976, 1977).

As demonstrated in the Examples below, LEDs with cathode layers comprising a thin layer of metal oxide exhibit performance (brightness, quantum efficiency, and stress life) comparable to, or better than, that of LEDs which employ conventional (e.g., metal) cathodes. The high brightness and quantum efficiency may be due to excellent electron injection via the n-type semiconducting metal oxide layer. Alternatively, the thin metal oxide layer may act to significantly reduce doping of the emissive layer, both at room temperature and elevated temperatures. (It is well known that doping quenches the electroluminescence of conjugated polymers: when thicker layers of low work function metal are used as the cathode, stress-induced doping causes the doping to extend deeper and deeper into polymer bulk during operation, thereby causing the efficiency and light output to drop during operation.)

Emissive Layers

In the LEDs of the present invention, the emissive layer (also referred to as the active layer, the luminescent layer, or the electroluminescent layer) comprises an electroluminescent, semiconducting, organic material. In one embodiment, material is polymeric. In one embodiment, the material is non-polymeric.

In one embodiment, the electroluminescent, organic material is an electroluminescent, semiconducting, organic polymer, which polymer is a π-conjugated polymer or is a co-polymer which contains segments of π-conjugated moieties. Conjugated polymers are well known in the art (see, for example, Bredas et al., 1991). Suitable examples of electroluminescent, semiconducting, organic polymers include, but are in no way limited to:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers;

(ix) polyp-phenylene) and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility;

(xiv) rigid rod polymers such as poly(p-phenylene-2,6-benzobisthiazole), poly(p-phenylene-2,6-benzobisoxazole), polyp-phenylene-2,6-benzimidazole), and their derivatives;

and the like.

In one embodiment, the electroluminescent organic material is an electroluminescent, semiconducting, organic, non-polymeric material of low molecular weight, which material is conjugated or contains segments of π-conjugated moieties. By the term "low molecular weight," it is meant that the material has a molecular weight of from about 100 to about 5000). Such materials are well known in the art (see, for example, VanSlyke et al., 1991a, 1991b, 1992). Suitable examples of electroluminescent semiconducting, organic, non-polymeric materials include, but are in no way limited to:

(i) tris(8-hydroxyquinolinato) aluminum (Alq);

(ii) 1,3-bis(N,N-dimethylaminophenyl)-1,3,4-oxidazole (OXD-8);

(iii) -oxo-bis(2-methyl-8-quinolinato)aluminum;

(iv) bis(2-methyl-8-hydroxyquinolinato) aluminum;

(v) bis(hydroxybenzoquinolinato) beryllium ($BeQ_2$);

(vi) bis(diphenylvinyl)biphenylene (DPVBI);

(vii) arylamine-substituted distyrylarylene (DSA amine); and the like.

Other examples of electroluminescent, semiconducting, organic, non-polymeric materials include dye-doped materials, which comprise a matrix material such as those listed above, and a dye-dopant. Examples of dye-dopants include, but are in no way limited to:

(i) coumarin;

(ii) quinacridone;

(iii) rubrene;

(iv) 4-dicyanomethylene-2-methyl-6-(p-dimethylaminostyryl)-4H-pyran (DCM1);

(v) tetraphenylporphyrin (TPP);

(vi) indigo;

and the like.

The emissive layer can typically be fabricated using any of the techniques known in the art, particularly those methods known in the art of organic and.polymer LEDs, including, for example, casting directly from solution, and casting of a polymer precursor followed by reaction (e.g., by heating) to form the desired polymer. The emissive layer may also comprise other materials, such as carrier polymers and additives. Typically, the emissive layer has a thickness of about 800to about 1500 Å, more preferably about 1000 Å.

Hole-injecting Anode Layers

The emissive layer of an LED of the present invention is typically bounded on one surface by an anode layer (although an intervening layer may be interposed, as described above). In one embodiment, the anode layer is transparent or semi-transparent. When a substrate is present, the anode layer is typically positioned between the substrate (e.g., deposited on the substrate) and the emissive layer.

The anode layer is a conductive layer which serves as a hole-injecting layer and which comprises a material with work function greater than about 4.5 eV. Typical anode materials include metals (such as aluminum, silver, platinum, gold, palladium, tungsten, indium, copper, iron, nickel, zinc, lead, and the like); metal oxides (such as lead oxide, tin oxide, indium/tin-oxide, and the like); graphite; doped inorganic semiconductors (such as silicon, germamum, gallium arsenide, and the like); and doped conducting polymers (such as polyaniline, polypyrrole, polythiophene, and the like). When metals such as those listed above are used, the anode layer is typically sufficiently thin so as to be semi-transparent to the light emitted from the emissive layer. Metal oxides such as indium/tin-oxide and conducting polymers such as polyaniline and polypyrrole are typically semi-transparent in the visible portion of the spectrum.

The anode layer can typically be fabricated using any of the techniques known in the art for deposition of thin films, including, for example, vacuum evaporation, sputtering, electron beam deposition, or chemical vapor deposition, using for example, pure metals or alloys, or other film precursors. Typically, the anode layer has a thickness of about 300 to about 3000 Å.

Encapsulation

It is typically preferred to encapsulate the LEDs of the present invention to prevent long term degradation. Methods of encapsulation are well known in the art. For example, devices can be sealed between glass plates, or sealed between barrier polymer layers.

EXAMPLES

The present invention is illustrated in the following examples, which are not intended to limit the scope of the invention as set forth in the appended claims.

Example 1

Light emitting diodes were fabricated using poly(2-(3,7-dimethyloctyloxy)-5-methoxy-1,4-phenylenevinylene) (MDMO-PPV) as the electroluminescent, semiconducting, organic polymer in the emissive layer. MDMO-PPV films having a thickness of 1000 Å were used. Indium/tin oxide (ITO) was used as the anode. The device architecture was ITO/MDMO-PPV/cathode. Devices were fabricated using both ITO on glass as the substrate (from Applied Films Corporation, Boulder, Colo., USA) and using ITO on plastic as the substrate (specifically, polyethylene teraphthalate, PET, from Courtauld Performance Films, Canoga Park, Calif., USA). In both cases, ITO was the anode and the hole-injecting contact.

Cathodes were fabricated using a thin layer of barium oxide. The metal oxide film was fabricated on top of the MDMO-PPV layer using vacuum vapor deposition at pressures around $1 \times 10^{-6}$ Torr (~0.13 mbar) yielding an active layer with area of 3 cm$^2$. The deposition was monitored with a STM-100 thickness/rate meter (from Sycon Instruments, Inc., East Syracuse, N.Y., USA). Calibration of the actual thickness and thickness distribution in substrate position inside evaporator was made by measuring a 1500 Å aluminum film using a surface profiler (Alpha-Step 500 Surface Profiler, from Tencor Instruments, San Jose, Calif., USA). The thicknesses of the barium oxide layers (denoted BaO) were 15, 30, 45, and 60 Å. Immediately after barium oxide deposition, 3,000 to 10,000 Å of aluminum was deposited on top of the barium oxide layer.

For comparison, otherwise identical devices were fabricated using a thin layer of barium metal instead of barium oxide.

For each of the devices, the current versus voltage curve, the light output versus voltage (I–V) curve, and the quantum efficiency were measured. The initial device performance data are summarized in Table 1.

TABLE 1

Initial Performance and Stress Life of LEDs with Cathodes Fabricated from a Layer of Barium Oxide in Comparison with Corresponding Barium Metal Layer

| | | Performance Before Stress | | |
|---|---|---|---|---|
| Cathode | Thickness (Å) | Quantum Efficiency (%) | Voltage (V) | Luminance (cd/m$^2$) |
| BaO | 15 | 2.5 | 3.2 | 128 |
| BaO | 30 | 2.9 | 3.4 | 148 |
| BaO | 45 | 2.6 | 3.3 | 129 |
| BaO | 60 | 2.3 | 3.3 | 130 |
| Ba | 30 | 2.9 | 3.1 | 148 |

Figure 2:
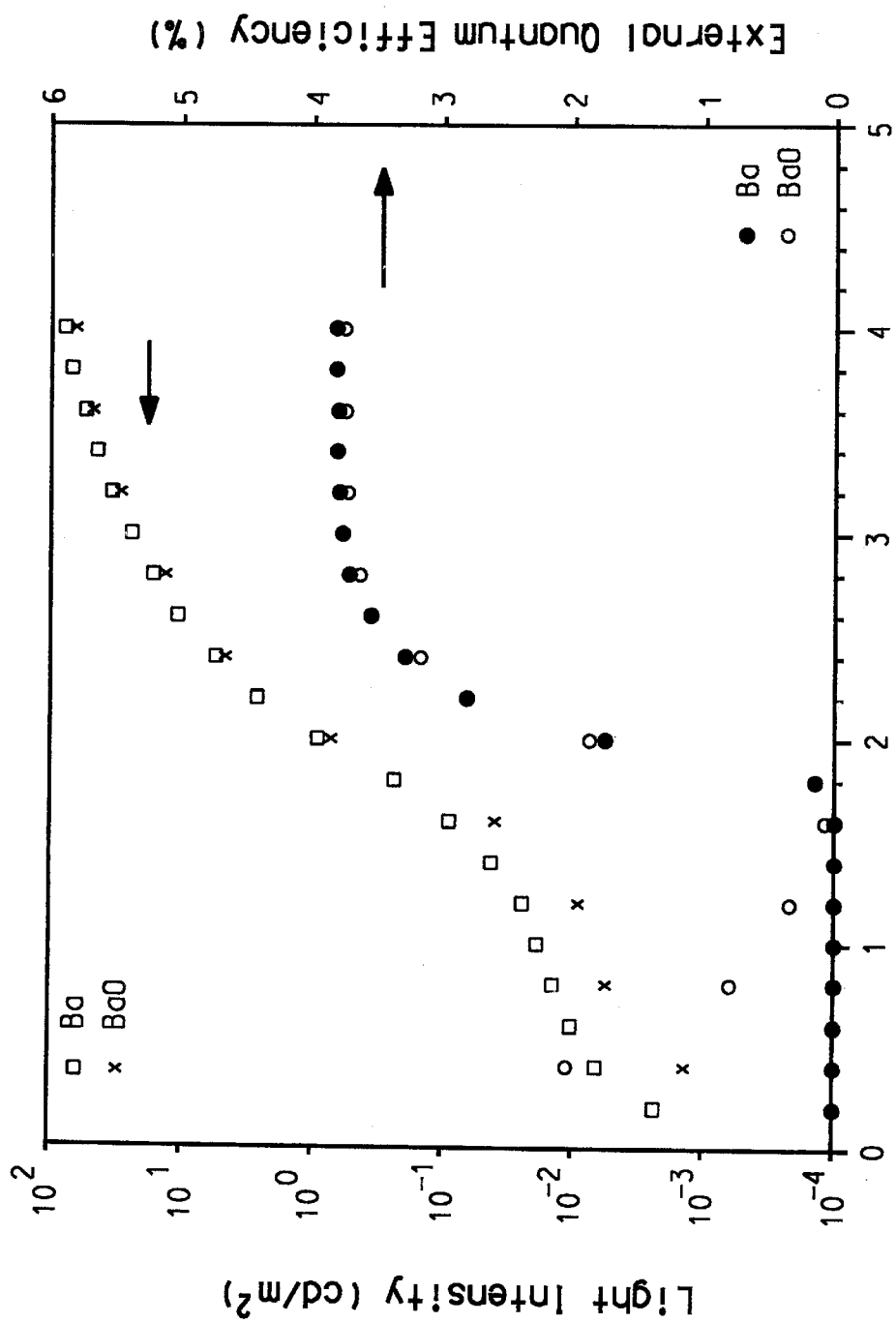
FIG. 2 is a graph of external quantum efficiency and light intensity (light output) versus bias voltage of LED devices having cathodes fabricated from 30 Å barium oxide and 30 Å barium metal.

FIG. 2 is a graph of external quantum efficiency and light intensity (light output) versus bias voltage of LED devices having cathodes fabricated from 30 Å barium oxide and 30 Å barium metal.

This example demonstrates that LEDs which employ a cathode using a thin layer of barium oxide emit light by electroluminescence, and that the quantum efficiency and stress life of the electroluminescence emission is comparable to that observed for otherwise identical LEDs with cathodes using a thin layer of barium metal.

Example 2

Example 1 was repeated, but the emissive layer, MDMO-PPV (orange-red emission) was replaced by different electroluminescent, semiconducting, organic polymers which have narrower band gaps and different peak electroluminescence wavelengths. The polymers employed are described in Table 2 below (see Spreitzer et al., 1998). The initial device performance data are summarized in Table 3 below.

TABLE 2

Electroluminescent Polymers

| $\lambda_{max}$ (nm) | Electroluminescent Polymer |
|---|---|
| 610 | poly(2-(3,7-dimethyloctyloxy)-5-methoxy-1,4-phenylenevinylene (MDMO-PPV) |
| 590 | poly(2-(4'-(3,7-dimethyloctyloxy)phenyl)-p-phenylenevinylene) co(2-(3,7-dimethyloctyloxy)-5-methoxy-1,4-phenylenevinylene) |
| 550 | poly(2-(4-(3,7-dimethyloctyloxy)phenyl)-p-phenylenevinylene) co(2-(3'-(3,7-dimethyloctyloxy)phenyl)-p-phenylenevinylene) co(2,5-bis(3,7-dimethyloctyloxy)-p-phenylenevinylene) |

TABLE 3

Initial Performance and Stress Life of LEDs with Emissive Layers Fabricated from Different Electroluminescent, Semiconducting, Organic Polymers and Cathodes Fabricated from a Layer of Barium Oxide

| | | Performance Before Stress* | | |
|---|---|---|---|---|
| $\lambda_{max}$ (nm) | BaO Thickness (Å) | Quantum Efficiency (%) | Voltage (V) | Luminance (cd/m$^2$) |
| 610 | 15 | 2.5 | 3.2 | 128 |
| 590 | 15 | 2.3 | 4.0 | 380 |
| 550 | 15 | 5.1 | 4.9 | 1080 |

*at current density of 8.3 mA/cm$^2$.

This example demonstrates that cathodes fabricated using barium oxide can be used as effective electron-injecting electrodes for a variety of electroluminescent, semiconducting, organic polymers with different band-gaps, and thus different emission colors.

Example 3

Example 1 was repeated, but barium oxide was replaced by lithium oxide (denoted $Li_2O$), magnesium oxide (denoted MgO), samarium oxide (denoted $Sm_2O_3$) and ytterbium oxide (denoted $Yb_2O_3$). As in Example 1, devices with corresponding metal (Li, Mg, and Sm) as cathode were fabricated for comparison. Initial device performance data are summarized in Table 4.

TABLE 4

Initial Performance and Stress Life of LEDs with Cathodes Fabricated from a Layer of Lithium Oxide, Magnesium Oxide, Samarium Oxide, and Ytterbium Oxide in Comparison with Corresponding Metal Layer

| Cathode | Thickness (Å) | Performance Before Stress* | | |
|---|---|---|---|---|
| | | Quantum Efficiency (%) | Voltage (V) | Luminance (cd/m$^2$) |
| $Li_2O$ | 5 | 2.2 | 3.6 | 115 |
| $Li_2O$ | 7 | 2.4 | 3.6 | 124 |
| $Li_2O$ | 10 | 2.4 | 3.5 | 124 |
| $Li_2O$ | 20 | 2.2 | 3.3 | 112 |
| $Li_2O$ | 30 | 2.o | 2.9 | 104 |
| Li | 10 | 2.3 | 3.7 | 117 |
| MgO | 40 | 1.3 | 3.6 | 64 |
| Mg | 200 | 0.007 | 3.9 | 0.3 |
| $Sm_2O_3$ | 30 | 1.7 | 3.5 | 90 |
| $Sm_2O_3$ | 45 | 1.2 | 3.5 | 63 |
| Sm(15 × 15) | 30 | 1.3 | 5.0 | 345** |
| $Yb_2O_3$ | 30 | 1.5 | 3.6 | 64 |
| $Yb_2O_3$ | 200 | 0.5 | 3.8 | 24 |
| Yb | 200 | 1.5 | 3.7 | 76 |

*at 8.3 mA/cm$^2$.
**at 35 mA/cm$^2$

This example again demonstrates that polymer LEDs with cathodes fabricated using a thin layer of alkali metal oxide, alkaline earth metal oxide, or lanthanide metal oxide, emit light by electroluminescence, and that the initial performance is comparable to, if not better than, that observed for otherwise identical LEDs with cathodes fabricated from a thin layer of the corresponding metal.

Example 4

Several of the devices of Example 1 and Example 3 were-encapsulated with a cover glass and UV curable epoxy (ELC-2500, from Electro-Lite Corporation, Danbury, Conn., USA), stressed at a constant current of 25 mA (current density 8.33 mA/cm$^2$) at 85° C. in an oven under ambient atmosphere. The light output was recorded by a photodiode placed 1 cm above each device as a function of stress time. Operating voltage changes were also recorded during stress.

The half-lives ($\tau_{1/2}$) of the encapsulated devices of Example 1 are shown in Table 5 below.

TABLE 5

Stress Life of LEDs with Cathodes Using A Barium Oxide Layer in Comparison with Corresponding Barium Metal Layer

| Cathode | Thickness (Å) | $\tau_{1/2}$ at 85° C. at 8.3 mA/cm$^2$ |
|---|---|---|
| BaO | 15 | 222 |
| BaO | 30 | 211 |

TABLE 5-continued

Stress Life of LEDs with Cathodes Using A Barium Oxide Layer in Comparison with Corresponding Barium Metal Layer

| Cathode | Thickness (Å) | $\tau_{1/2}$ at 85° C. at 8.3 mA/cm$^2$ |
|---|---|---|
| BaO | 45 | 204 |
| BaO | 60 | 169 |
| Ba | 30 | 237 |

Figure 3:
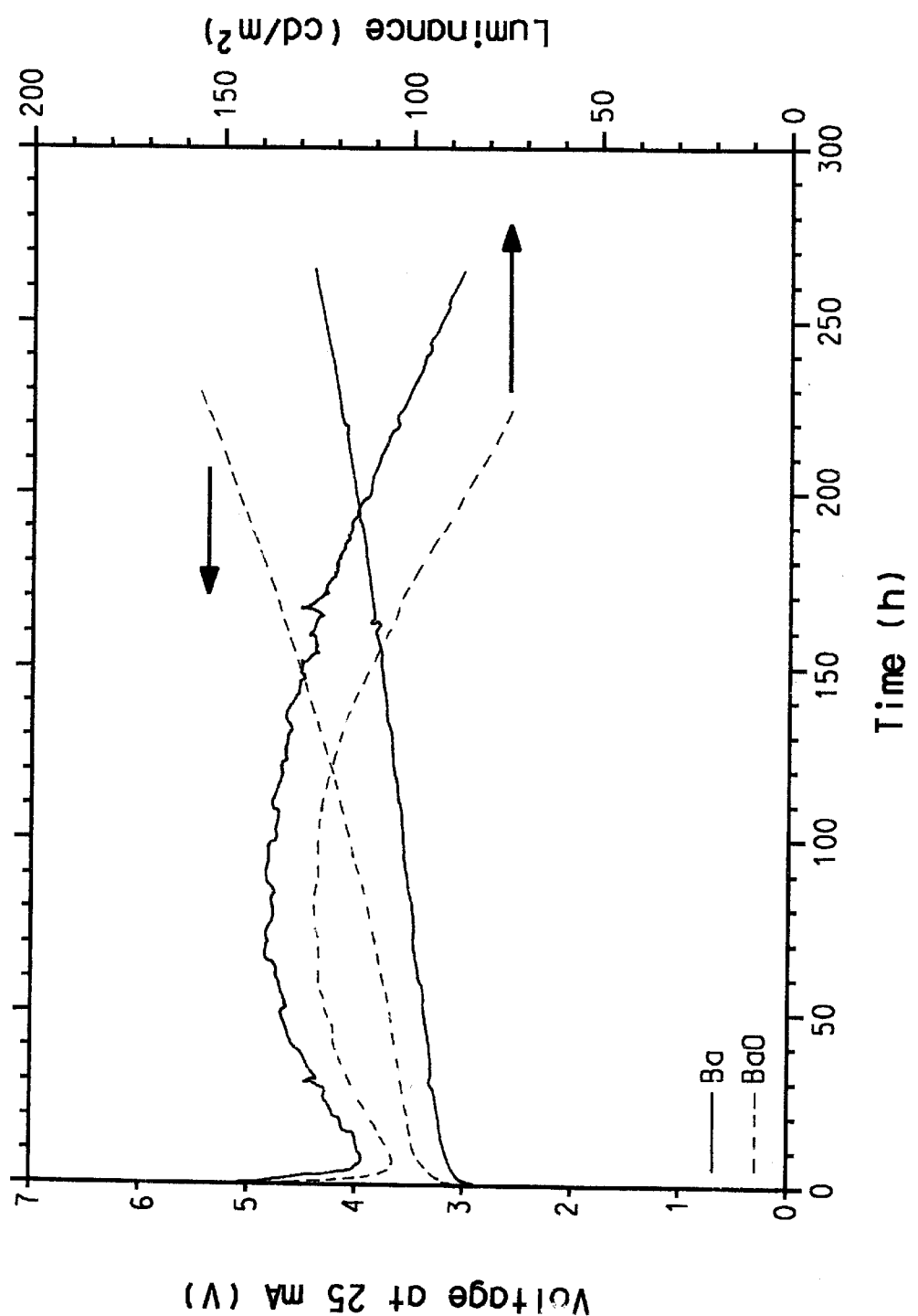
FIG. 3 is a graph of the luminance and voltage at 25 mA versus time during continuous stress (8.3 mA/cm$^2$ at 85° C.) of an LED device having a cathode fabricated from a 30 Å barium oxide layer, as compared to an otherwise identical device with a cathode fabricated from a 30 Å barium metal layer.

FIG. 3 is a graph of the luminance and voltage at 25 mA versus time during continuous stress (8.3 mA/cm$^2$ at 85° C.) of an LED device having a cathode fabricated from a 30 Å barium oxide layer, as compared to an otherwise identical device with a cathode fabricated from a 30 Å barium metal layer.

Figure 4:
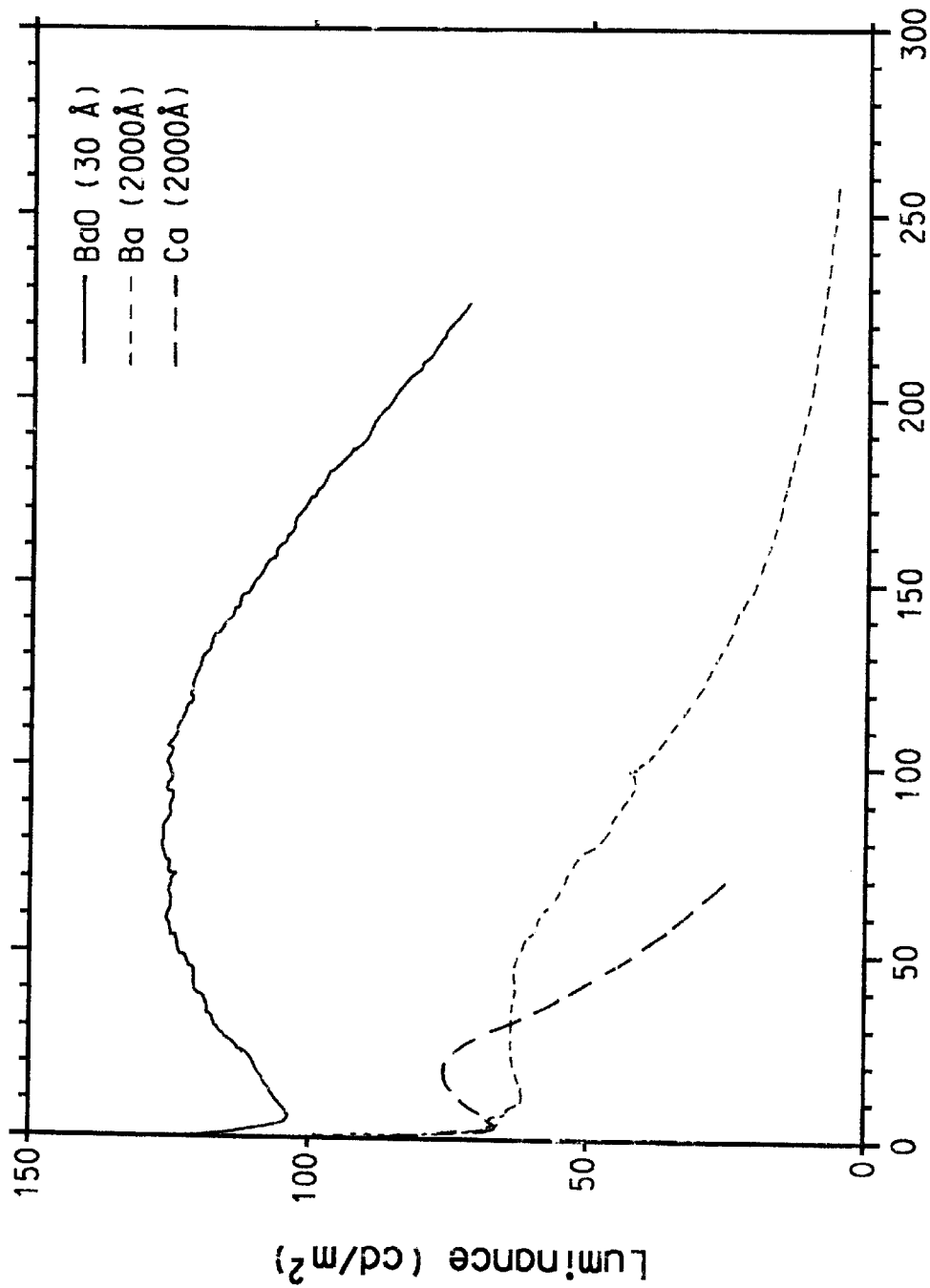
FIG. 4 is a graph of the decay of the electroluminescence emission (luminance) as a function of continuous stress time (at 85° C. and 8.3 mA/cm$^2$) for LED devices having cathodes fabricated from a 30 Å barium oxide layer, a 2000 Å barium metal layer, and a 2000 Å calcium metal layer.

FIG. 4 is a graph of the decay of the electroluminescence emission (luminance) as a function of continuous stress time (at 85° C. and 8.3 mA/cm$^2$) for LED devices having cathodes fabricated from a 30 Å barium oxide layer, a 2000 Å barium metal layer, and a 2000 Å calcium metal layer. The thin barium oxide cathode yielded significantly longer lifetime and much higher luminance at the same current density (i e., much high efficiency).

Figure 5:
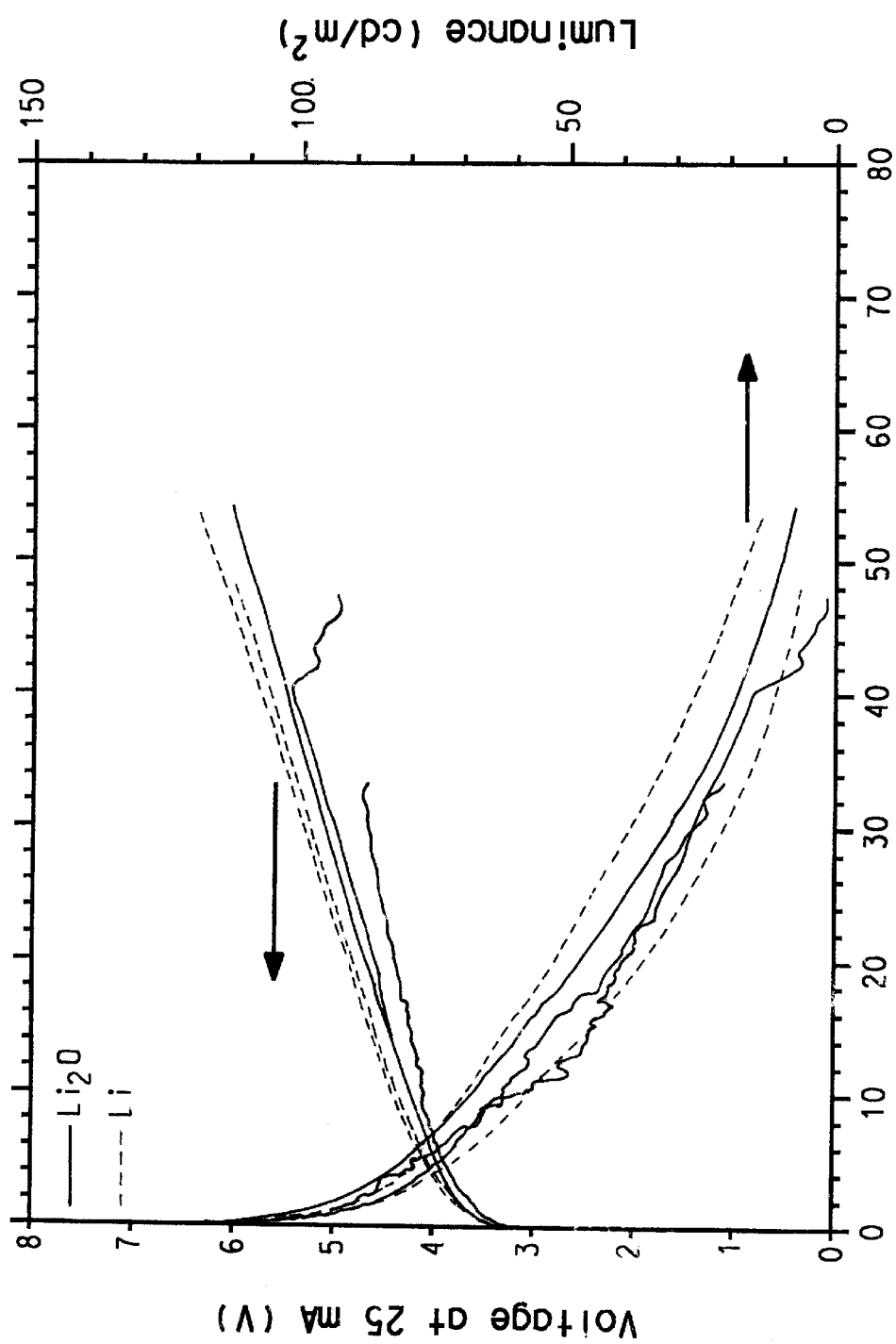
FIG. 5 is a graph of luminance and voltage at 25 mA versus time during continuous stress (8.3 mA/cm$^2$ at 85° C.) of LED devices having cathodes fabricated from a thin lithium oxide layer (7 Å and 10 Å), as compared to otherwise identical devices with cathodes fabricated from a lithium metal layer (10 Å).

FIG. 5 is a graph of luminance and voltage at 25 mA versus time during continuous stress (8.3 mA/cm$^2$ at 85° C.) of LED devices having cathodes fabricated from a thin lithium oxide layer (7 Å, and 10 Å), as compared to otherwise identical devices with cathodes fabricated from a lithium metal layer (10 Å).

This Example demonstrates that the stress life of LEDs with cathodes fabricated from a thin layer of alkali metal oxide, alkaline earth metal oxide, or lanthanide metal oxide, is comparable to, if not better than, that observed for otherwise identical LEDs with cathodes fabricated from the corresponding metal.

References

Berggren, M., Inganas, O., Gustafsson, G., Rasmusson, J., Andersson, M. R., Hjertberg T., Wennerstrom, O., "Controlling colour by voltage in polymer light emitting diodes," *Synthetic Metals*, Vol. 71, pp. 2185–2186 (1995).

Braun, D., Gustafsson, G., McBranch D., Heeger, A. J., "Electroluminescence and electrical transport in poly(3-thiophene) diodes," *J. Appl. Phys.*, Vol. 72, pp. 564–568 (1992).

Braun, D., and Heeger, A. J., "Visible light emission from semiconducting polymer diodes," *Appl. Phys. Lett.*, Vol. 58, pp. 1982–1984 (1991).

Bredas, J.-L., Silbey, R., eds., *Conjugated Polymers*, Kluwer Academic Press, Dordrecht (1991).

Burroughs, J. H., Bradley, D. D. C., Brown, A. R., Marks, R. N., Mackay, K., Friend, R. H., Burns, P. L., Holmes, A. B., "Light-emitting diodes based on conjugated polymers," *Nature*, Vol. 347, pp. 539–541 (1990).

Cao, Y., Smith, P., Heeger, A. J., "Optical quality transparent conductors," U.S. Pat. No. 5,626,795 issued May 6, 1997.

Friend, R. H., Burroughes, J. H., Bradley, D. D., "Electroluminescent devices," U.S. Pat. No. 5,247,190 issued Sep. 21, 1993.

G. Gustafsson, G., Cao, Y., Treacy, G. M., Klavetter, F., Colaneri, N., Heeger, A. J., "Flexible Light-emitting diodes made from soluble conducting polymers." *Nature*, Vol. 357, pp. 477–479 (1992).

Greenham, N. C. Moratti, S. C., Bradley, D. D. C., Friend, R. H., Holmes, A. B., "Efficient light-emitting diodes based on polymers with high electron affinities," *Nature*, Vol. 365, pp. 628–630 (1993).

Grem, G., Leditzky, G., Ullrich, B., Leising, G., "Realization of blue-light-emitting device using poly(-p-phenylene)," *Adv. Mater.*, Vol. 4, pp. 36–37 (1992).

Haas, G. A., Shih, A., Thomas, R. E., "Determination of conduction band and electron affinity in surface potential measurements of BaO", *J. Appl. Phys.*, Vol. 47, pp. 5400–5404 (1976).

Haas, G. A., Shih, A., Thomas, R. E., "Electronic and chemical behavior of oxygen in BaO films on Ir(100)" *Applications of Surface Sci.*, Vol. 1. pp. 59–80 (1977).

Heeger, A. J., Braun, D., "Visible light emitting diodes fabricated from soluble semiconducting polymers," U.S. Pat. No. 5,408,109 issued Apr. 18, 1995.

Holmes, A., Bradley, D. D., Friend, R. H., Kraft, A., Burn, P., Brown, A., "Semiconductive copolymers for use in luminescent devices," U.S. Pat. No. 5,512,654, issued Apr. 30, 1996.

Kido, J., Shionoya, H., Nagai, K., "Single-layer white light-emitting organic electroluminescent devices based on dye-dispersed poly(N-vinylcarbazole),"*Appl. Phys. Lett.*, Vol. 67, No. 16, pp. 2281–2283 (1995).

Nakano et al., "Organic electroluminescence device," U.S. Pat. No. 5,317,169, issued May 31, 1994.

Parker, I. D., "Carrier tunneling and device characteristics in polymer light-emitting diodes," *J. Appl. Phys.*, Vol. 75, No. 3, pp. 1656–1666, (1994b).

Parker, I. D., Kim, H. H., "Fabrication of polymer light-emitting diodes using doped silicon electrodes," *Appl. Phys. Lett.*, Vol. 64, No. 14, pp. 1774–1776 (1994c).

Parker, I. D., Pei, Q., Marrocco, M., "Efficient blue electroluminescence from a fluorinated polyquinoline,"*Appl. Phys. Lett.*, Vol. 65, No. 10, pp. 1272–1274 (1994a).

Scott, J. C., Kaufman, J. H., Brock, P. J., DiPietro, R., Salem, J., Goitia, J. A., "," *J. Appl. Phys.*, Vol. 79, No. 5, pp. 2745–2751 (1996).

Spreitzer, H., Kreuder, W., Becker, H., Schoo, H., Demandt, R., "Aryl-substituted poly(p-arylene vinylenes), method for the production and use thereof in electroluminescent components," published International (PCT) Patent Application No. WO 98/27136, published Jun. 25, 1998.

Tumareva, T. A., Ivanov, V. A., Kirsanova, T. S., Vasil'eva, N. S., "Field-electron spectroscopy of barium oxide films with various structures," *Sov. Phys. Solid State*, Vol. 31, No. 2, pp. 182–185 (1989).

Utsugi, K., "Organic thin film electroluminescent device," U.S. Pat. No. 5,747,930, issued May 5, 1998.

VanSlyke, S. A., "Blue emitting internal junction organic electroluminescent device (I)," U.S. Pat. No. 5,151,629, issued Sep. 29, 1992.

VanSlyke, S. A., "Organic electroluminescent device with stabilized cathode," U.S. Pat. No. 5,047,687, issued Sep. 10, 1991 (1991a).

VanSlyke, S. A., Tang, C. W., "Electroluminescent device with improved cathode," U.S. Pat. No. 5,059,862, issued Oct. 22, 1991(1991b).

Wudl, F., Hoger, S., Zhang, C., Pakbaz, K., Heeger, A. J., "Conjugated Polymers for Organic LED'S: Poly[2,5-bis (-3α-5β-cholestanoxy)-phenylenevinylene] (BCHA-PPV): A Processible Yellow Light Emitter," *Polymer Preprints*, Vol. 34,. No. 1, pp. 197–198 (1993b).

Wudl, F., Srdanov, G., "Conducting polymer formed of poly(2-methoxy,5-(2'-ethyl-hexyloxy)-p-phenylenevinylene)," U.S. Pat. No. 5,189,136, issued May 23, 1993 (1993a).

Yang, Y., "Bilayer composite electrodes for diodes," U.S. Pat. No. 5,723,873, issued Mar. 3, 1998.

Yang, Y., Heeger, A. J., "Polyaniline as a transparent electrode for polymer light-emitting diodes:lower operating voltage and higher efficiency," *Appl. Phys. Lett.*, Vol. 64, No. 10, pp. 1245–1247 (1994).

Yang, Y., Westerweele, E., Zhang, C., Smith, P., Heeger, A. J., "Enhanced performance of polymer light-emitting diodes using high-surface area polyaniline network electrode," *J. Appl. Phys.*, Vol. 77, No. 2, pp. 694–698 (1995).

Yang, Z., Sokolik, I., Karasz F. E., "Soluble blue light-emitting polymer," *Macromolecules*, Vol. 26, pp. 1188–1190 (1993).

Yu, G., Heeger, A. J., "High efficiency photonic devices made with semiconducting polymers," *Synthetic Metals*, Vol. 85, pp. 1183–1186 (1997).

Zhang, C., Hoger, S., Pakbaz, K., Wudl, F., Heeger, A. J., "Improved efficiency in green polymer light-emitting diodes with air-stable electrodes," *J. Electron. Mater.*, Vol. 23, No. 5, pp. 453–458 (1994a).

Zhang, C., von Seggem, H., Pakbaz, K., Kraabel, B., Schmidt, H.-W., Heeger, A. J., "Blue electroluminescent diodes utilizing blends of poly(p-phenylphenylene vinylene) in poly(9-vinylcarbazole)," *Synthetic Metals*, Vol. 62, pp. 35–40 (1994b).

Zhang, C., Yu, G., Cao, Y., "Long operating life for polymer light-emitting diodes," U.S. Pat. No. 5,798,170, issued Aug. 25, 1998.

What is claimed is:

1. A light-emitting diode comprising:
    (a) a hole-injecting anode layer;
    (b) an electron-injecting cathode layer; and,
    (c) an emissive layer;
    wherein:
        (i) said emissive layer is interposed between said anode layer and said cathode layer;
        (ii) said emissive layer comprises an electroluminescent, semiconducting, organic material;
        (iii) said cathode layer comprises a layer of metal oxide having a thickness of from about 5 to about 200 Å; and,
        (iv) said metal oxide is selected from the group consisting of alkali metal oxides, alkaline earth metal oxides, lanthanide metal oxides, and combinations thereof, wherein the alkali metal oxides and alkaline earth metal oxides are selected from mixed oxides, non-stoichiometric oxides, and combinations thereof.

2. A light emitting diode according to claim 1, wherein said metal oxide is selected from the group consisting of alkali metal oxides.

3. A light emitting diode according to claim 1, wherein said metal oxide is selected from the group consisting of oxides of lithium, sodium, potassium, rubidium, and cesium.

4. A light emitting diode according to claim 1, wherein said metal oxide is lithium oxide.

5. A light emitting diode according to claim 1, wherein said metal oxide is selected from the group consisting of alkaline earth metal oxides.

6. A light emitting diode according to claim 1, wherein said metal oxide is selected from the group consisting of oxides of magnesium, calcium, strontium, and barium.

7. A light emitting diode according to claim 1, wherein said metal oxide is selected from the group consisting of oxides of magnesium and barium.

8. A light emitting diode according to claim 1, wherein said metal oxide is selected from the group consisting of lanthanide metal oxides.

9. A light emitting diode according to claim 1, wherein said metal oxide is selected from the group consisting of oxides of neodymium, samarium, and ytterbium.

10. A light emitting diode according to claim 2, wherein said layer of metal oxide has a thickness of from about 10 to about 100 Å.

11. A light emitting diode according to claim 2, wherein said layer of metal oxide has a thickness of from about 20 to about 60 Å.

12. A light emitting diode according to claim 5, wherein said layer of metal oxide has a thickness of from about 10 to about 100 Å.

13. A light emitting diode according to claim 5, wherein said layer of metal oxide has a thickness of from about 20 to about 60 Å.

14. A light emitting diode according to claim 8, wherein said layer of metal oxide has a thickness of from about 10 to about 100 Å.

15. A light emitting diode according to claim 8, wherein said layer of metal oxide has a thickness of from about 20 to about 60 Å.

16. A light emitting diode according to claim 2, wherein said cathode layer further comprises a capping layer comprising aluminum, silver, or copper.

17. A light emitting diode according to claim 5, wherein said cathode layer further comprises a capping layer comprising aluminum, silver, or copper.

18. A light emitting diode according to claim 8, wherein said cathode layer further comprises a capping layer comprising aluminum, silver, or copper.

19. A light emitting diode according to claim 2, wherein said electroluminescent, semiconducting, organic material is an electroluminescent, semiconducting, organic polymer.

20. A light emitting diode according to claim 5, wherein said electroluminescent, semiconducting, organic material is an electroluminescent, semiconducting, organic polymer.

21. A light emitting diode according to claim 8, wherein said electroluminescent, semiconducting, organic material is an electroluminescent, semiconducting, organic polymer.

22. A light emitting diode according to claim 2, wherein said electroluminescent, semiconducting, organic material is selected from the group consisting of: poly(p-phenylene vinylene)s, poly(arylene vinylene)s, poly(p-phenylene)s, poly(arylene)s, and polyquinolines.

23. A light emitting diode according to claim 5, wherein said electroluminescent, semiconducting, organic material is selected from the group consisting of: poly(p-phenylene vinylene)s, poly(arylene vinylene)s, poly(p-phenylene)s, poly(arylene)s, and polyquinolines.

24. A light emitting diode according to claim 8, wherein said electroluminescent, semiconducting, organic material is selected from the group consisting of: poly(p-phenylene vinylene)s, poly(arylene vinylene)s, poly(p-phenylene)s, poly(arylene)s, and polyquinolines.

25. A light emitting diode according to claim 2, wherein said electroluminescent, semiconducting, organic material is poly(2-(3,7-dimethyloctyloxy)-5-methoxy-1,4-phenylene vinylene).

26. A light emitting diode according to claim 5, wherein said electroluminescent, semiconducting, organic material is poly(2-(3,7-dimethyloctyloxy)-5-methoxy-1,4-phenylene vinylene).

27. A light emitting diode according to claim 8, wherein said electroluminescent, semiconducting, organic material is poly(2-(3,7-dimethyloctyloxy)-5-methoxy-1,4-phenylene vinylene).

28. A light emitting diode according to claim 2, wherein said electroluminescent, semiconducting, organic material is an electroluminescent, semiconducting, organic non-polymeric material.

29. A light emitting diode according to claim 5, wherein said electroluminescent, semiconducting, organic material is an electroluminescent, semiconducting, organic non-polymeric material.

30. A light emitting diode according to claim 8, wherein said electroluminescent, semiconducting, organic material is an electroluminescent, semiconducting, organic non-polymeric material.

* * * * *